US011890676B2

(12) United States Patent
Benedict et al.

(10) Patent No.: US 11,890,676 B2
(45) Date of Patent: Feb. 6, 2024

(54) WAVEGUIDE FENCE SUPPORT

(71) Applicant: Raytheon Company, Waltham, MA (US)

(72) Inventors: James Benedict, Andover, MA (US); Raquel M. Doyen, Marlborough, MA (US); Brian J. Duffy, Marlborough, MA (US); Judith E. Gill, Dallas, TX (US); Erica Klek, Wilmington, MA (US); Jacob Steinberg, Dallas, TX (US)

(73) Assignee: Raytheon Missiles & Defense (RMD), Tucson, AZ (US)

( * ) Notice: Subject to any disclaimer, the term of this patent is extended or adjusted under 35 U.S.C. 154(b) by 130 days.

(21) Appl. No.: 17/176,115

(22) Filed: Feb. 15, 2021

(65) Prior Publication Data

US 2022/0258244 A1 Aug. 18, 2022

(51) Int. Cl.
*B22F 10/47* (2021.01)
*B33Y 10/00* (2015.01)
*B33Y 80/00* (2015.01)
*B33Y 40/20* (2020.01)
*B22F 10/28* (2021.01)
*G01R 1/02* (2006.01)
(Continued)

(52) U.S. Cl.
CPC .............. *B22F 10/47* (2021.01); *B22F 10/28* (2021.01); *B33Y 10/00* (2014.12); *B33Y 40/20* (2020.01); *B33Y 80/00* (2014.12); *G01R 1/02* (2013.01); *G01R 29/0878* (2013.01); *B22F 2301/052* (2013.01); *H01P 11/002* (2013.01); *Y10T 29/49002* (2015.01)

(58) Field of Classification Search
CPC .... B22F 10/47; B22F 10/28; B22F 2301/052; B33Y 10/00; B33Y 40/20; H01P 11/002
See application file for complete search history.

(56) References Cited

U.S. PATENT DOCUMENTS 9,052,481 B2 6/2015 Brunner et al.
10,396,422 B1 8/2019 Rojas et al.
10,800,108 B2 * 10/2020 Mark ................... B22F 3/1118
(Continued)

FOREIGN PATENT DOCUMENTS

AU 2020202717 A1 12/2020
FR 3051924 A1 12/2017
(Continued)

OTHER PUBLICATIONS

Ankang Liu et.al. "A Compact 3-D Printed Asymmetric Orthogonal Mode Transducer" IEEE Transactions on Antennas and Propagation, vol. 69, No. 6, Jun. 2021 (available online Dec. 18, 2020) (Year: 2020).*

*Primary Examiner* — Brian D Walck
*Assistant Examiner* — Nazmun Nahar Shams
(74) *Attorney, Agent, or Firm* — Locke Lord LLP; Joshua L. Jones; Gabrielle L. Gelozin

(57) ABSTRACT

A method of making a waveguide for a radar system includes forming an additive manufacturing build of a waveguide by forming an initial layer, followed by forming a succession of build layers on the initial layer in a build direction from the initial layer towards a final layer. Forming the succession of build layers includes forming an overhanging feature supported by a support formed in the succession of build layers.

16 Claims, 5 Drawing Sheets

(51) Int. Cl.
    *G01R 29/08*     (2006.01)
    *H01P 11/00*     (2006.01)

(56) References Cited

U.S. PATENT DOCUMENTS

| | | | |
|---|---|---|---|
| 10,833,382 | B2 | 11/2020 | Sysouphat |
| 2019/0190161 | A1* | 6/2019 | Hollenbeck .......... H01Q 21/068 |
| 2019/0248064 | A1 | 8/2019 | Smith et al. |
| 2020/0194860 | A1 | 6/2020 | Hollenbeck et al. |
| 2020/0353682 | A1 | 11/2020 | Fedynyshyn et al. |
| 2020/0373657 | A1* | 11/2020 | Aston ...................... H01Q 9/16 |

FOREIGN PATENT DOCUMENTS

| | | | |
|---|---|---|---|
| JP | 2020513478 | A | 5/2020 |
| WO | WO-2019203902 | A2 | 10/2019 |
| WO | WO-2019229515 | A1 | 12/2019 |
| WO | WO-2020114992 | A1 | 6/2020 |

* cited by examiner

WAVEGUIDE FENCE SUPPORT

STATEMENT REGARDING FEDERALLY SPONSORED RESEARCH

This invention was made with government support under government contract W31P4Q-15-C-0022 awarded by the United States Army Contracting Command-Redstone. The government has certain rights in the invention.

BACKGROUND

1. Field

The present disclosure relates generally to additive manufacturing, and in particular to additive manufacturing for waveguides such as used in radar systems.

2. Description of Related Art

Radar systems use waveguides to direct electromagnetic (EM) wave energy. Sometimes the horn of a waveguide introduces EM waves or receives EM waves from/to air. The horn of a typical waveguide can contain fence features that tune or otherwise change the waveguide or horn structure for better electrical properties. These fence features are very difficult to make, usually requiring a casting or extremely complicated brazing.

Recently additive manufacturing has been proven to create radio frequency (RF) waveguides and horn structures at C-Band and lower frequencies. Many waveguide geometries contain special features that tune the electrical response, but the geometries are difficult to machine and braze. For example, some radar systems have a fence geometry to suppress higher order electrical modes.

The conventional techniques have been considered satisfactory for their intended purpose. However, there is an ever present need for improved systems and methods for create fence geometries in waveguide system. This disclosure provides a solution for this need.

SUMMARY

A method of making a waveguide for a radar system includes forming an additive manufacturing build of a waveguide by forming an initial layer, followed by forming a succession of build layers on the initial layer in a build direction from the initial layer towards a final layer. Forming the succession of build layers includes forming an overhanging feature supported by a support formed in the succession of build layers. Forming the additive manufacturing build can include using powder bed fusion to form the additive manufacturing build of a AlSi$_{10}$Mg material. The initial layer can be formed on a build plate, and forming the support can be performed without anchoring the overhanging feature to the build plate.

Forming the support can include building the support up in successive layers from an initial support layer to a final support layer that contacts a first layer of the overhanging feature. The final support layer can contact the first layer of the overhanging feature at a plurality of spaced apart points, and. The initial support layer can contact an underlying layer of the additive manufacturing build at a plurality of spaced apart points. Forming the supports can include forming the supports offset from an adjacent feature.

The support can include a plurality of upper notch layers underlying the final support layer. The upper notch layers and final support layer can form a plurality of upper notches between the support and the overhanging feature. Each of the upper notches can be v-shaped and narrowing away from the overhanging feature. Forming the support can also include forming a plurality of lower notch layers above the initial support layer. The lower notch layers and the initial support layer can form a plurality of lower notches between the underlying layer and the support. Each of the lower notches can be v-shaped, narrowing away from the underlying layer. Forming the support can include forming the support with a plurality of perforation apertures therethrough configured to facilitate breaking the support.

The additive manufacturing build can be a radar waveguide, and the overhanging feature can be a fence across an electromagnetic (EM) wave passage that extends in the build direction. The fence can be oriented 90-degrees perpendicular to sidewalls of the EM wave passage and to the build direction. The fence and EM wave passage can be one of multiple fences and respective EM wave passages formed in the additive manufacturing build, and the fences and EM wave passages can be arrayed together in a waveguide formation. Each EM wave passage can include three columns supporting the respective fence, and the support can be one of four supports spaced apart from one another by the columns.

The method can include removing the support from the additive manufacturing build, Removing the support from the additive manufacturing build can include breaking contact points of the support and additive manufacturing build, where the contact points are between notches formed in the support. Removing the support from the additive manufacturing build can also include a manual deburring process. The manual deburring process can include removing surface roughness from points of contact between the support and the additive manufacturing build after removal of the support to match or exceed smoothness of the remaining additive manufacturing build away from the points of contact.

A method of making a waveguide for a radar system can include forming a non-additively manufactured waveguide, including forming a support between an overhanging feature across an electromagnetic (EM) wave passage and a surface of the waveguide, and removing the supports from the waveguide.

These and other features of the systems and methods of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
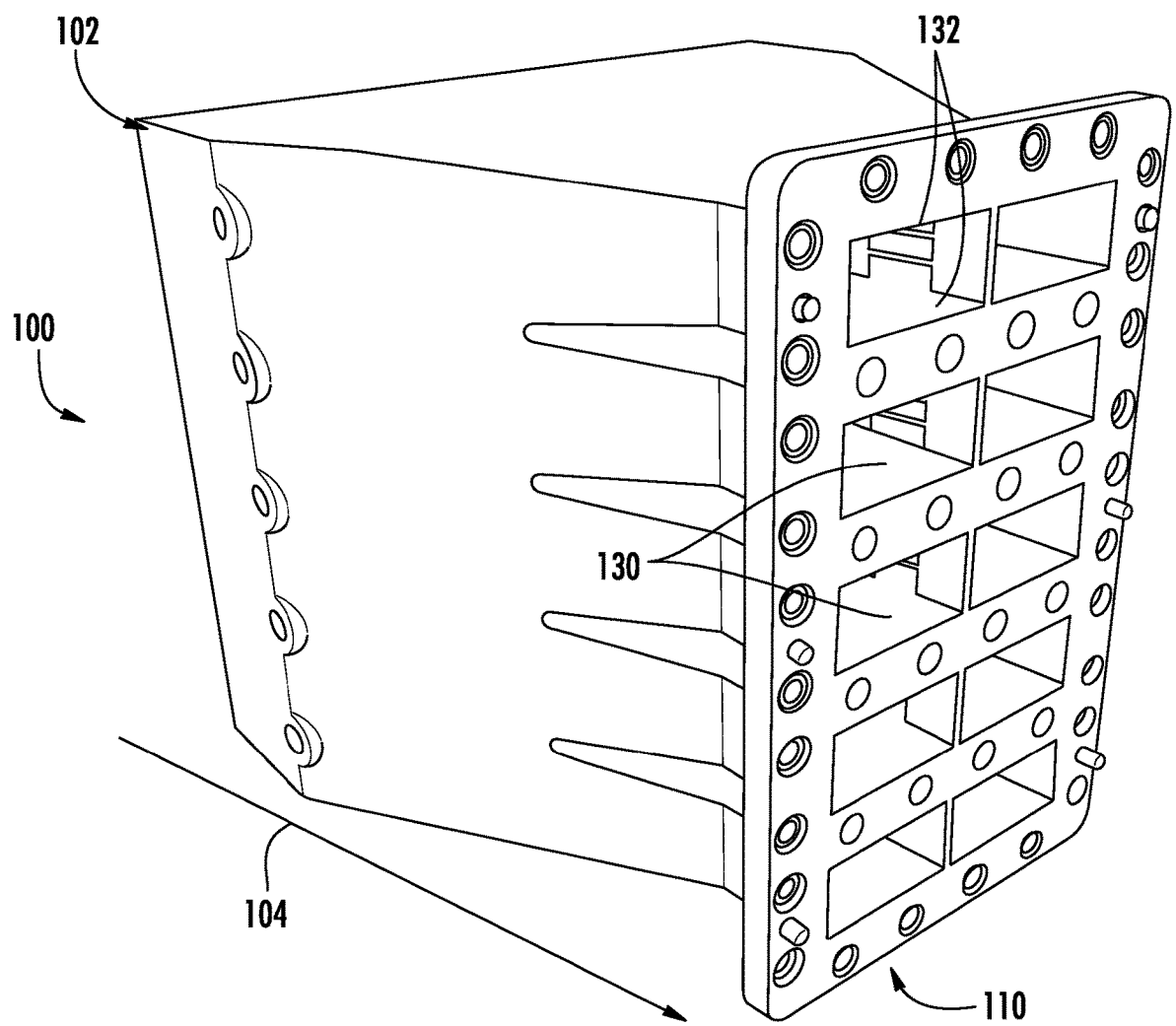
FIG. 1 is a side perspective view of an embodiment of an additively manufactured build constructed in accordance with the present disclosure, showing a waveguide.

Reference will now be made to the drawings wherein like reference numerals identify similar structural features or aspects of the subject disclosure. For purposes of explanation and illustration, and not limitation, a partial view of an embodiment of a system in accordance with the disclosure is shown in FIG. 1 and is designated generally by reference character 100. Other embodiments of systems in accordance with the disclosure, or aspects thereof, are provided in FIGS. 2-4, as will be described. The systems and methods described herein can be used to create fence geometries in waveguide systems.

A method of making a waveguide 100 for a radar system is disclosed. The method as described herein is described with respect to an additively manufactured waveguide 100, however, it should be appreciated by those skilled in the art that at least some portions of the following method can be used for making a non-additively manufactured waveguide, or any additively manufactured build having an overhanging feature.

Figure 2:
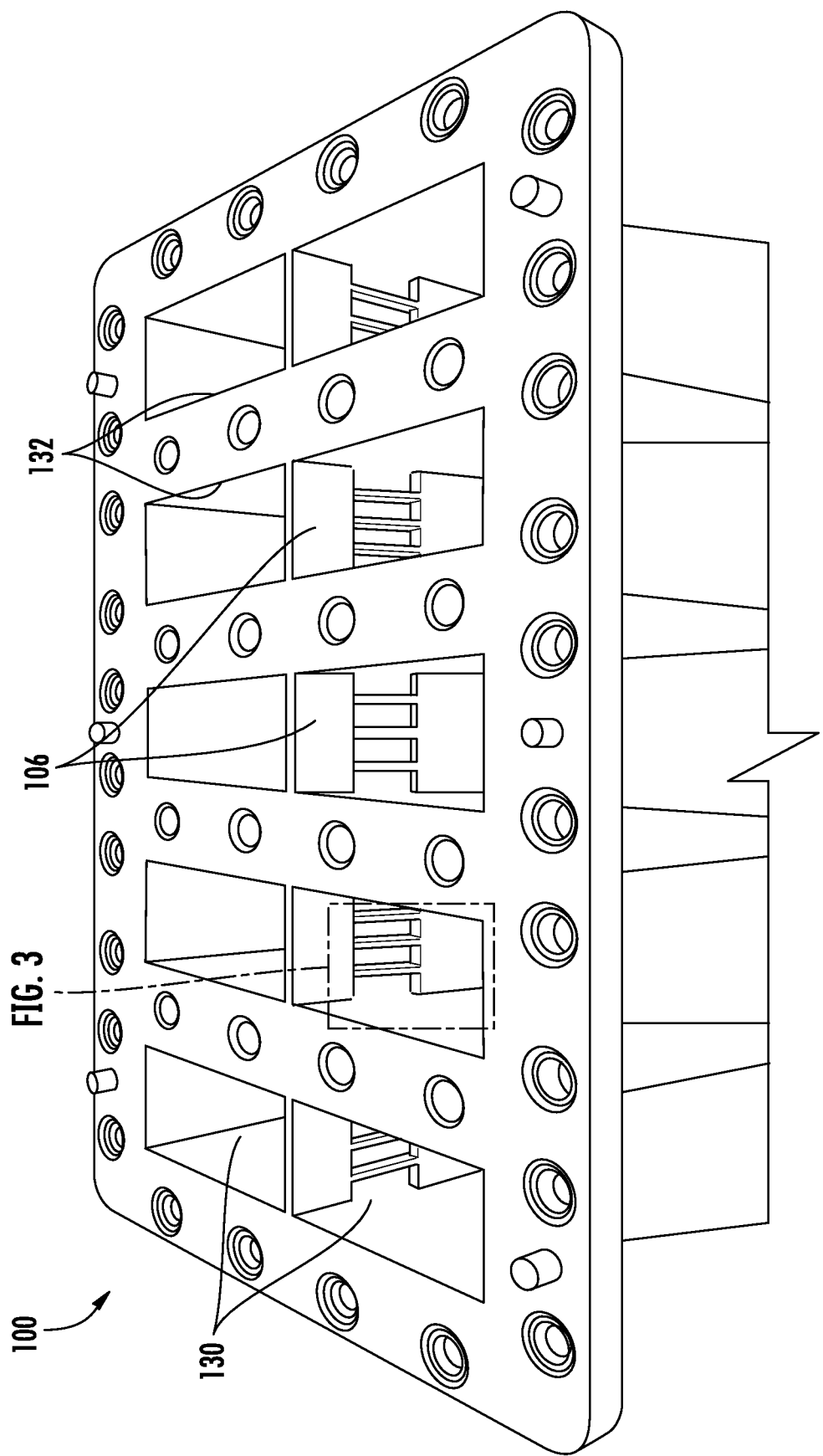
FIG. 2 is a top perspective view of the waveguide of FIG. 1, showing an overhanging feature.

Shown in FIGS. 1-2, an additively manufacturing build (e.g. a waveguide 100) can be formed. An initial layer 102 can be formed (e.g. on a build plate), followed by forming a succession of build layers on the initial layer in a build direction (e.g. arrow 104) from the initial layer 102 towards a final layer 110. Forming the succession of build layers can include forming an overhanging feature 106 supported by a support 108 (shown in FIG. 4). The overhanging feature 106 can be a fence (e.g. for tuning or improving electrical properties of the waveguide 100) across an electromagnetic (EM) wave passage 130, where the wave passage 130 extends in the build direction 104. The support 108 can be formed in the succession of build layers and can be performed without anchoring the overhanging 106 feature to the build plate. The waveguide 100 can be formed using laser powder bed fusion, for example the powder bed including $AlSi_{10}Mg$.

Figure 3:
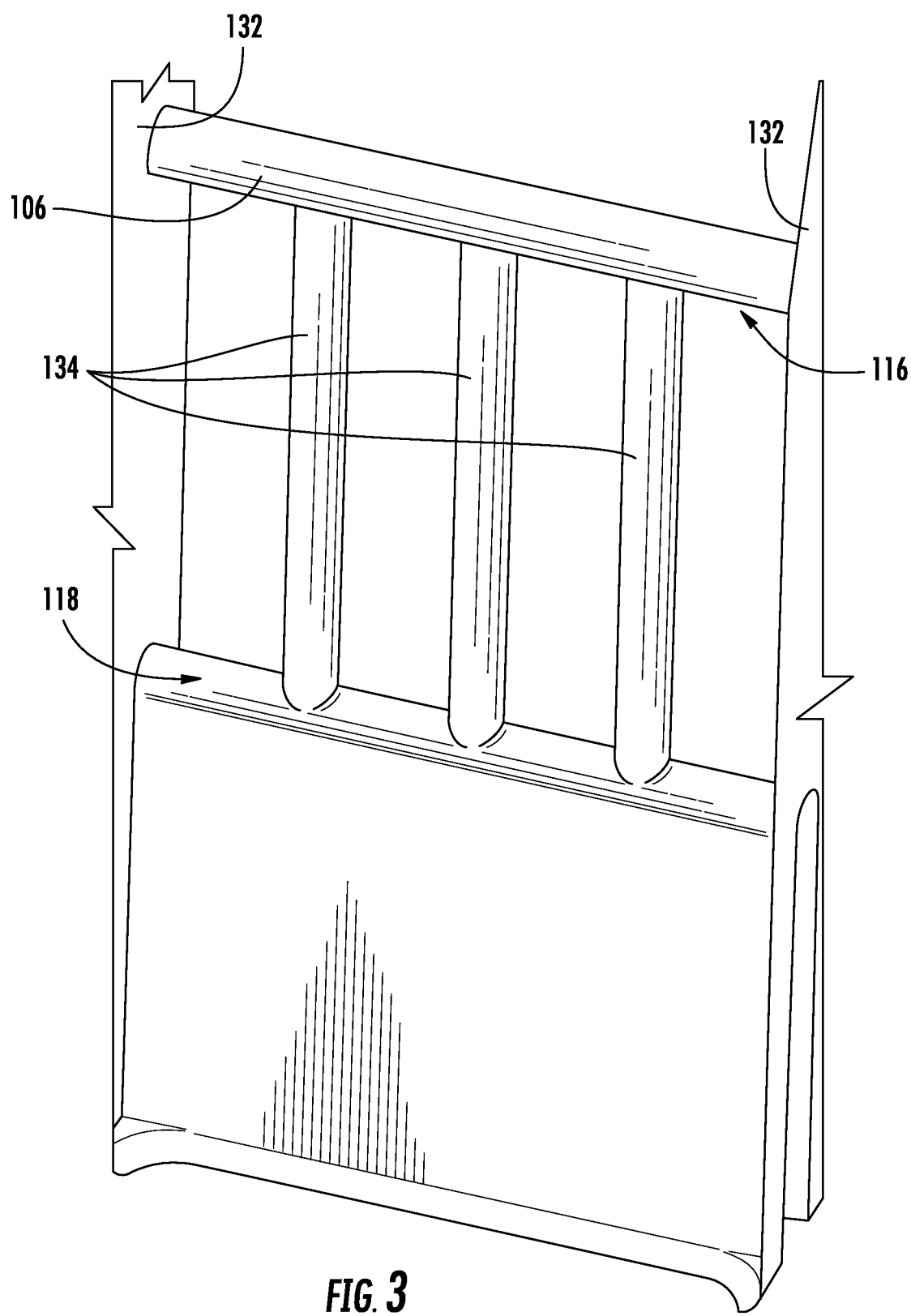
FIG. 3 is an enlarged schematic perspective view of the overhanging feature of FIG. 3.
Figure 4:
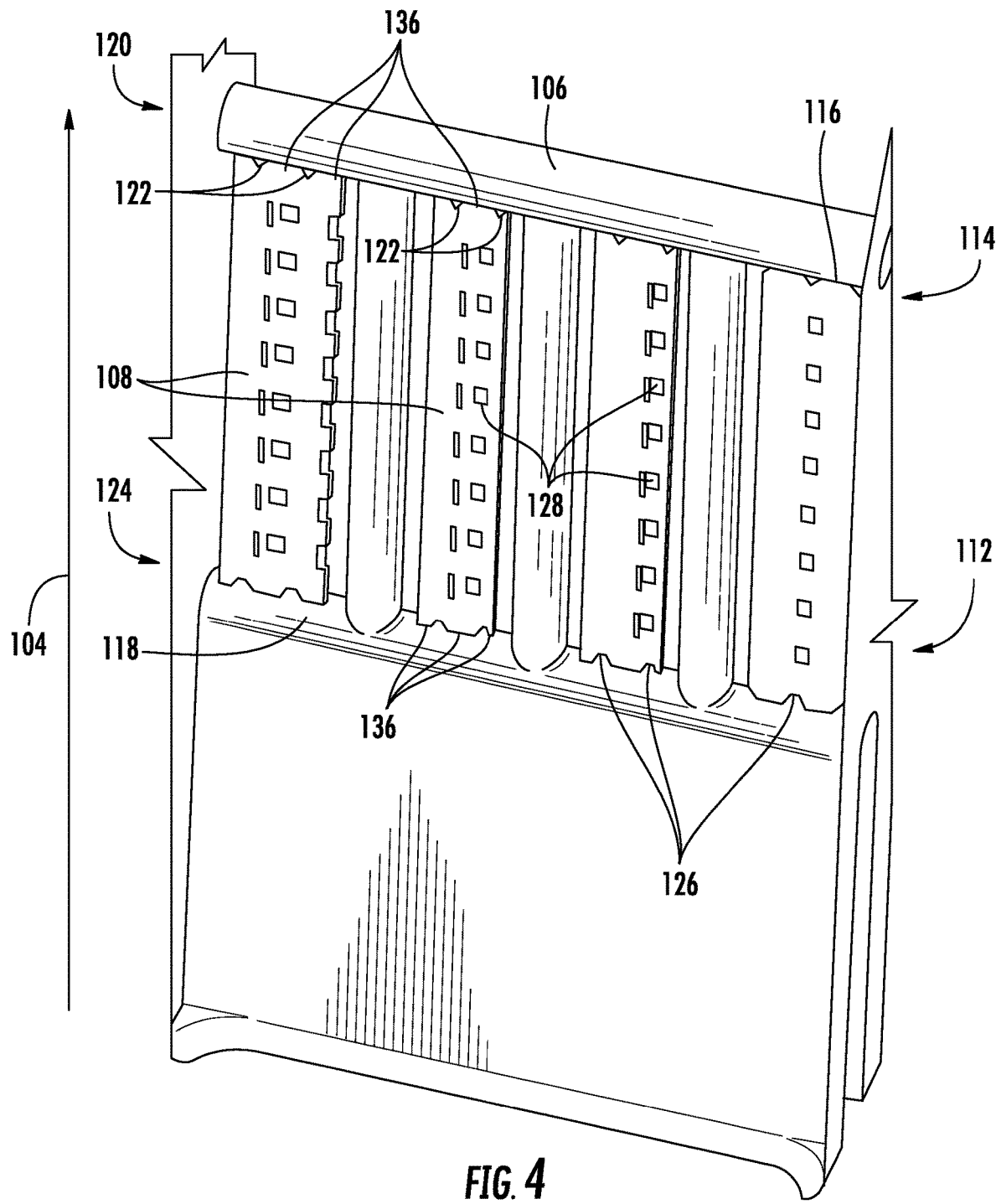
FIG. 4 is a schematic perspective view of the overhand feature of FIG. 3, showing a support included under the overhanging feature during the additive manufacturing of the build.

Referring to FIGS. 2-4, the fence 106 can be oriented 90-degrees perpendicular to sidewalls 132 of the EM wave passage 130 and to the build direction 104. The fence 106 and EM wave passage 130 can be one of multiple fences 106 and respective EM wave passages 130 formed in the waveguide 100, each fence 106 and EM wave passage 130 can be identical or similar to one another. In embodiments, the fences 106 and EM wave passages 130 can be arrayed together in a waveguide formation, as shown in the completed waveguide 100 in FIGS. 1-2. Each EM wave passage 130 can include three columns 134 supporting each respective fence 106, for example for C-band wave guiding, and the support 108 can be one of any number of supports 108 spaced apart from one another by the columns 134. While four supports 108 are shown in FIG. 4, it should be appreciated that any number of supports 108 can be used, for example depending on the total number of columns 134 used in the waveguide 100.

The support 108 can be built up in successive layers from an initial support layer 112 to a final support layer 114 that contacts a first layer 116 of the overhanging feature 106. The initial support layer 112 and the final support layer 114 can contact an underlying layer 118 of the waveguide and the first layer 116 of the fence 106 respectively, at a plurality of spaced apart points (contacts 136). Because the support 108 contacts the waveguide 100 at a plurality of points, post-build removal of the supports is facilitated and the surface finishing can be improved, as discussed below. Similarly, the support 108 can be built offset from adjacent vertical features (e.g. sidewalls 132 and/or columns 134) to avoid creating additional contact points. If the support 108 were built directly adjacent to the vertical part features, the vertical part features would exhibit roughness and burrs. The offset thus prevents such roughness and burrs, improving surface quality during the build.

Figure 5:
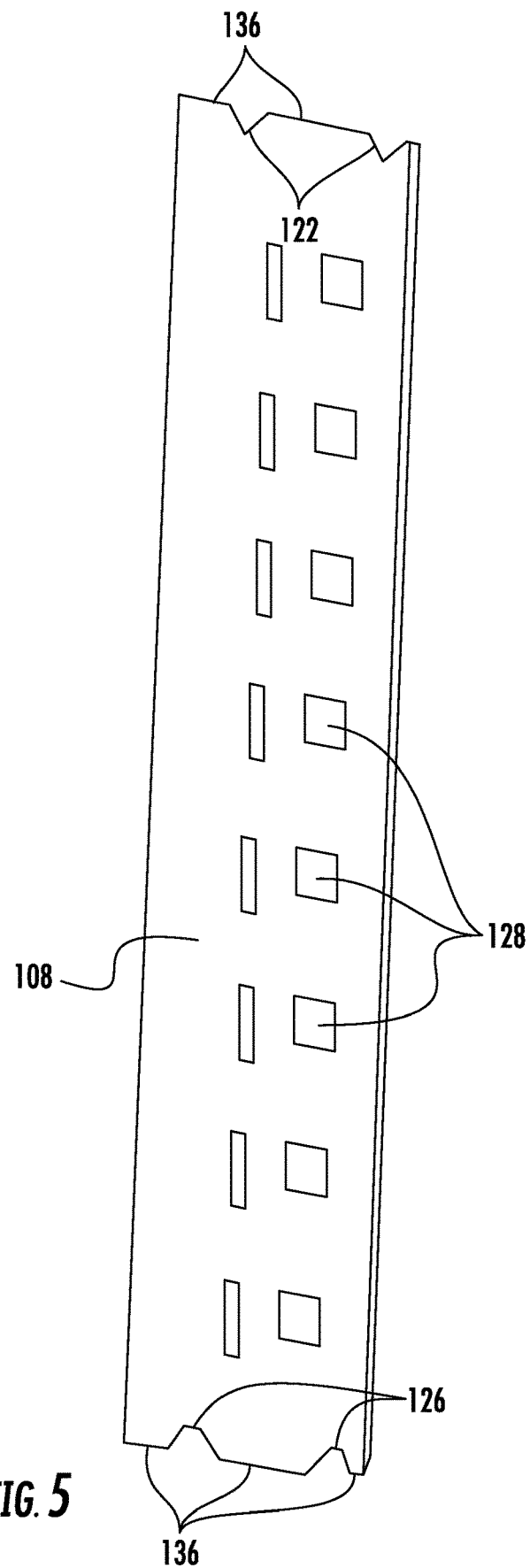
FIG. 5 is an enlarged schematic view of the support of FIG. 4.

Turning to FIGS. 3-5, the support 108 can include a plurality of upper notch layers 120 underlying the final support layer 114. The upper notch layers 120 and final support layer 114 can form a plurality of upper notches 122 between the support 108 and the overhanging feature 106. Each of the upper notches 120 can be v-shaped, narrowing away from the overhanging feature 106. Similarly, a plurality of lower notch layers 124 can be formed above the initial support layer 112. A plurality of lower notches 126 are therefore formed between the underlying layer 118 and the support 108. Each of the lower notches 126 can also be v-shaped, narrowing away from the underlying layer 118. Further, the support 108 can include a plurality of perforation apertures 128 defined therethrough configured to facilitate breaking the support 108 when the support 108 is removed after completion of the additive manufacturing build.

After completion of the build of the waveguide 100, the supports 108 can be removed from the waveguide 100. Removing the support 108 can include breaking contact points 136 between the support 108 and the waveguide 100 (e.g. at the interfaces between the support 108 and the underlying layer 118 and the overhanging feature 106), where the contact points 136 are between the notches 122, 126. Removing the support 108 can also include further surface processing, such as a manual deburring process. The manual deburring process can include removing surface roughness from points of contact (e.g. contacts 136) between the support 108 and the waveguide 100 after removal of the support 108. The geometry of the support 108 can be such that when removed for deburring, the surface of contact points 136 match or exceed smoothness of the remaining waveguide 100 away from the points of contact.

Conventional waveguides are typically cast designs or brazements that require difficult high temperature manufacturing properties which can add to lead times and cost, creating risk for the programs. Further, creating fence features in a cast or brazed waveguide can be extremely complex to build and surface finish, therefore the surface quality of the fence structures can suffer. The methods and systems of the present disclosure, as described above and shown in the drawings, provide for improved fence geometry having a surface roughness less than 300 micro-inches Ra. While the apparatus and methods of the subject disclosure have been shown and described, those skilled in the art will readily appreciate that changes and/or modifications may be made thereto without departing from the scope of the subject disclosure.

What is claimed is:

1. A method of making a waveguide for a radar system comprising:
    forming an additive manufacturing build of a waveguide by forming an initial layer, followed by forming a succession of build layers on the initial layer in a build direction from the initial layer towards a final layer, wherein forming the succession of build layers includes forming an overhanging feature supported by a support formed in the succession of build layers, wherein the additive manufacturing build is a radar waveguide, and wherein the overhanging feature is a fence across an electromagnetic (EM) wave passage that extends in the build direction, wherein forming the support includes building the support up in successive layers from an initial support layer to a final support layer that contacts a first layer of the fence, followed by removing the support from the fence in the EM wave passage.

2. The method as recited in claim 1, wherein the final support layer contacts the first layer of the overhanging feature at a plurality of spaced apart points.

3. The method as recited in claim 2, wherein the support includes a plurality of upper notch layers underlying the final support layer, wherein the upper notch layers and final support layer form a plurality of upper notches between the support and the overhanging feature.

4. The method as recited in claim 3, wherein each of the upper notches are all v-shaped, narrowing away from the overhanging feature.

5. The method as recited in claim 1, wherein the initial support layer contacts an underlying layer of the additive manufacturing build at a plurality of spaced apart points.

6. The method as recited in claim 5, wherein forming the support includes forming a plurality of lower notch layers above the initial support layer, wherein the lower notch layers and the initial support layer form a plurality of lower notches between the underlying layer and the support.

7. The method as recited in claim 6, wherein each of the lower notches are all v-shaped, narrowing away from the underlying layer.

8. The method as recited in claim 1, wherein forming the support includes forming the support with a plurality of perforation apertures therethrough configured to facilitate breaking the support.

9. The method as recited in claim 1, wherein forming the supports includes forming the supports offset from an adjacent feature.

10. The method as recited in claim 1, wherein the fence is oriented 90-degrees perpendicular to sidewalls of the EM wave passage and to the build direction.

11. The method as recited in claim 1, wherein the fence and EM wave passage are one of multiple fences and respective EM wave passages formed in the additive manufacturing build, wherein the fences and EM wave passages are arrayed together in a waveguide formation.

12. The method as recited in claim 11, wherein each EM wave passage includes three columns supporting the respective fence, and wherein the support is one of four supports spaced apart from one another by the columns.

13. The method as recited in claim 1, wherein removing the support from the additive manufacturing build includes breaking contact points of the support and additive manufacturing build, wherein the contact points are between notches formed in the support.

14. The method as recited in claim 13, wherein removing the support from the additive manufacturing build includes a manual deburring process, wherein the manual deburring process includes removing surface roughness from points of contact between the support and the additive manufacturing build after removal of the support to match or exceed smoothness of the remaining additive manufacturing build away from the points of contact.

15. The method as recited in claim 1, wherein forming the additive manufacturing build includes using powder bed fusion to form the additive manufacturing build of a $AlSi_{10}Mg$ material.

16. The method as recited in claim 1, wherein the initial layer is formed on a build plate, and wherein forming the support is performed without anchoring the overhanging feature to the build plate.

* * * * *

UNITED STATES PATENT AND TRADEMARK OFFICE
CERTIFICATE OF CORRECTION

PATENT NO. : 11,890,676 B2
APPLICATION NO. : 17/176115
DATED : February 6, 2024
INVENTOR(S) : Benedict et al.

Page 1 of 1

It is certified that error appears in the above-identified patent and that said Letters Patent is hereby corrected as shown below:

In the Specification

In Column 3, Line 42, delete "106 feature" and insert --feature 106-- therefor

In Column 4, Line 19, delete "120" and insert --122-- therefor

Signed and Sealed this
Seventeenth Day of December, 2024

Derrick Brent
*Acting Director of the United States Patent and Trademark Office*